(12) United States Patent
Haeberlen et al.

(10) Patent No.: US 8,492,243 B2
(45) Date of Patent: Jul. 23, 2013

(54) METHOD FOR THE PRODUCTION OF A SEMICONDUCTOR STRUCTURE

(75) Inventors: Maik Haeberlen, Cambridge (GB); Brian Murphy, Pfarrkirchen (DE)

(73) Assignee: Siltronic AG, Munich (DE)

( * ) Notice: Subject to any disclaimer, the term of this patent is extended or adjusted under 35 U.S.C. 154(b) by 277 days.

(21) Appl. No.: 12/863,506

(22) PCT Filed: Jan. 21, 2009

(86) PCT No.: PCT/EP2009/000353
§ 371 (c)(1),
(2), (4) Date: Jul. 19, 2010

(87) PCT Pub. No.: WO2009/095173
PCT Pub. Date: Aug. 6, 2009

(65) Prior Publication Data
US 2010/0291756 A1    Nov. 18, 2010

(30) Foreign Application Priority Data

Jan. 30, 2008 (DE) .................. 10 2008 006 745

(51) Int. Cl.
*H01L 21/30* (2006.01)
(52) U.S. Cl.
USPC .................. 438/455; 257/E21.099
(58) Field of Classification Search
USPC ............. 438/26, 459, 455; 257/E21.099
See application file for complete search history.

(56) References Cited

U.S. PATENT DOCUMENTS

| | | | |
|---|---|---|---|
| 5,352,615 A * | 10/1994 | Limb et al. | 438/477 |
| 5,479,382 A * | 12/1995 | Nishida et al. | 369/13.35 |
| 6,258,699 B1 | 7/2001 | Chang et al. | |
| 6,328,796 B1 | 12/2001 | Kub et al. | |
| 6,559,075 B1 | 5/2003 | Kelly et al. | |
| 6,589,811 B2 * | 7/2003 | Sayyah | 438/106 |
| 7,294,564 B2 * | 11/2007 | Attenberger et al. | 438/526 |
| 7,495,261 B2 * | 2/2009 | Kusunoki et al. | 257/94 |
| 7,596,849 B1 * | 10/2009 | Carpenter et al. | 29/592.1 |
| 8,198,148 B2 * | 6/2012 | Koo et al. | 438/164 |

(Continued)

FOREIGN PATENT DOCUMENTS

| EP | 1727190 A1 | 11/2006 |
|---|---|---|
| EP | 1901345 A1 | 3/2008 |

(Continued)

OTHER PUBLICATIONS

Salem et al., "Thermal Expansion and Elastic Anisotropy in Single Crystal Al2O3 and SiC Reinforcements," NASA Technical Memorandum 106516, Dec. 1986, pp. 1-10.*

(Continued)

*Primary Examiner* — Matthew Landau
*Assistant Examiner* — Joseph C Nicely
(74) *Attorney, Agent, or Firm* — Brooks Kushman P.C.

(57) ABSTRACT

Semiconductor structures are produced by providing a 3C—SiC semiconductor layer containing a monocrystalline 3C—SiC layer by implantation of carbon in silicon on a first silicon substrate and applying an epitaxial layer of nitride compound semiconductor suitable for the generation of optoelectronic components onto the 3C—SiC semiconductor layer structure, wherein the epitaxial layer of nitride semiconductor is transferred onto a second substrate by bonding the nitride layer onto the second substrate surface and mechanically or chemically removing silicon and layers containing SiC, the second substrate being a metal with a reflectivity $\geq 80\%$ or being substantially transparent.

15 Claims, 1 Drawing Sheet

U.S. PATENT DOCUMENTS

| | | | |
|---|---|---|---|
| 2002/0187895 A1* | 12/2002 | Izaki et al. | 502/330 |
| 2003/0104678 A1 | 6/2003 | Kelly et al. | |
| 2004/0072382 A1 | 4/2004 | Kelly et al. | |
| 2004/0072383 A1* | 4/2004 | Nagahama et al. | 438/47 |
| 2004/0104390 A1 | 6/2004 | Sano et al. | |
| 2006/0040468 A1 | 2/2006 | Kelly et al. | |
| 2006/0151801 A1 | 7/2006 | Doan et al. | |
| 2006/0267024 A1* | 11/2006 | Murphy et al. | 257/77 |
| 2007/0020884 A1* | 1/2007 | Wang et al. | 438/455 |
| 2007/0031097 A1* | 2/2007 | Heikenfeld et al. | 385/129 |
| 2007/0141803 A1* | 6/2007 | Boussagol et al. | 438/455 |
| 2007/0293386 A1* | 12/2007 | Goto | 501/4 |
| 2008/0164571 A1 | 7/2008 | Kelly et al. | |
| 2008/0224297 A1* | 9/2008 | Oppermann et al. | 257/690 |
| 2009/0040418 A1* | 2/2009 | Kao et al. | 349/61 |
| 2009/0085180 A1* | 4/2009 | Kan et al. | 257/675 |
| 2009/0160334 A1* | 6/2009 | Inoue et al. | 313/582 |
| 2009/0250248 A1* | 10/2009 | Kan et al. | 174/252 |
| 2009/0310347 A1* | 12/2009 | Lath | 362/231 |

FOREIGN PATENT DOCUMENTS

| | | |
|---|---|---|
| JP | 2005303287 A | 10/2005 |
| JP | 2006-019648 A | 1/2006 |
| KR | 1020060121756 A | 11/2006 |
| WO | 98/14986 A1 | 4/1998 |
| WO | 03/034484 A2 | 4/2003 |
| WO | 2005/091391 A1 | 9/2005 |
| WO | 2006076209 A2 | 7/2006 |

OTHER PUBLICATIONS

Q.Y. Tong and U. Goesele, "Semiconductor Wafer Bonding", (Science and Technology), Wiley Interscience Publications.

Peng, Wei Chih et al., AlGaInP Light-Emitting Diodes With Metal Substrate Fabricated By Wafer Bonding, Conference No. 7, Paris, France, 2003, vol. 19, S. 144-153, ISBN 1-56677-402-0.

Ito et al., "Ion Beam Synthesis of 3C-SiC Layers In Si and Its Application in Buffer Layer for GaN Epitaxial Growth", Applied Surface Science, Elsevier, Amsterdam, NL, Bd. 238, Nr. 1-4, Nov. 15, 2004, Seiten 159-164, XP004580803; ISSN: 0169-4332.

Morita D. et al., "High Output Power 365 nm Ultraviolet Light Emitting Diode of GaN-Free Structure", Japanese Journal of Applied Physics, Tokyo, JP, Bd. 42, Nr. 12B, Part 02, Dec. 15, 2002, Seiten L1434-L1436, XP01162409 ISSN: 0021-4922.

Dorsaz et al., "First InGaN/GaN Thin Film LED Using SiCOI Engineered Substrate", Physica Status Solidi (C), Wiley-VCH vERLAG, bERLIN, de, bD. 3, nR. 6, Jun. 1, 2006, sEITEN 2227-2230, xp007902947 issn: 1610-1634.

Chuong Anh Tran et al., "High Brightness GaN Vertical Light Emitting Diodes on Metal Alloyed Substrate For General Lighting Application", Journal of Crystal Growth, 298 (2007) 722.

* cited by examiner

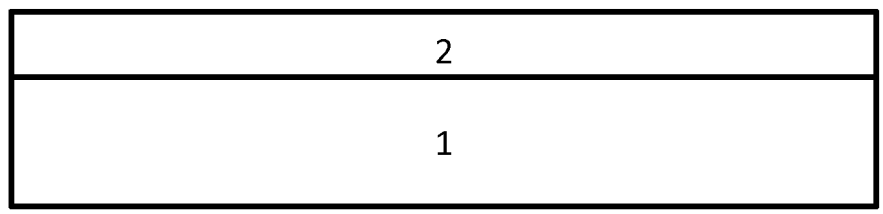
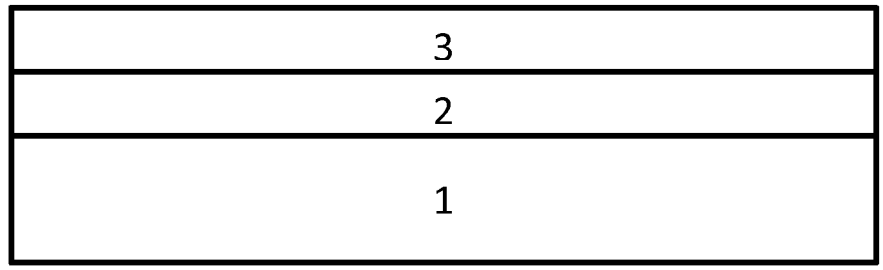
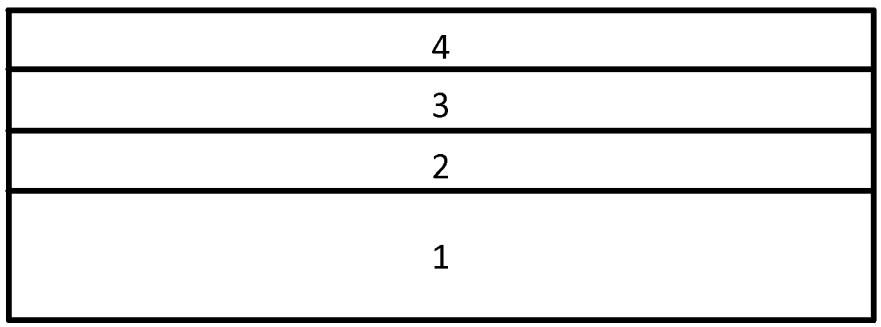
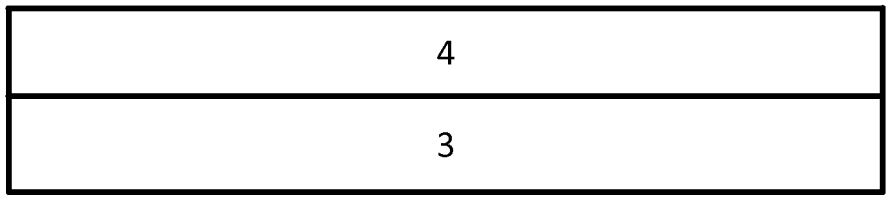

METHOD FOR THE PRODUCTION OF A SEMICONDUCTOR STRUCTURE

CROSS-REFERENCE TO RELATED APPLICATION

This application is the U.S. national phase of PCT Appln. No. PCT/EP2009/000353 filed Jan. 21, 2009 which claims priority to German application DE 10 2008 006 745.8 filed Jan. 30, 2008.

BACKGROUND OF THE INVENTION

1. Field of the Invention

The invention relates to a method for producing a semiconductor structure, in particular a semiconductor structure for optoelectronics.

2. Description of the Related Art

Owing to the lack of large-area monocrystalline substrates, high-power or optoelectronic components made of semiconductor materials with a wide bandgap ("wide-bandgap semiconductors") such as GaN, AlGaN or InGaN—are nowadays often produced heteroepitaxially on suitable foreign substrates, for example monocrystalline sapphire or silicon carbide.

Such foreign substrates may, however, have properties detrimental to the function of the components produced on them. Some of these problems are known from C. A. Tran et al., Journal of Crystal Growth 298 (2007) 722. Sapphire has a relatively low thermal conductivity compared with other materials, the effect of which is that heat losses in high-power or optoelectronic components produced on it can be dissipated only poorly, which detrimentally affects the component function. It is furthermore known that LED structures, which are initially generated on sapphire but subsequently transferred onto a metal alloy substrate, have more favorable properties in respect of efficiency.

The use of silicon carbide (SiC) as a substrate resolves the heat loss problem owing to its high thermal conductivity. However, only few methods are available for generating SiC cost-effectively and on sizeable substrates. Bulk SiC substrates are available only up to a diameter of 100 mm.

U.S. Pat. No. 6,328,796 discloses an alternative method, in which a 3C—SiC layer is generated by carbonizing the surface of a silicon wafer which serves as a donor wafer, subsequently bonding the SiC layer of the silicon donor wafer onto a carrier wafer made of polycrystalline SiC, and then removing the rest of the silicon donor wafer in order to expose the SiC layer. Using polycrystalline SiC as a substrate has the advantage that, in contrast to silicon, the thermal expansion coefficients of GaN and SiC are relatively similar to one another. This can be advantageous for further heat treatment steps.

WO 03/034484 discloses another method with which, by means of ion beam synthesis (IBS), monocrystalline silicon carbide layers of the 3C polytype can be generated on silicon substrates (IBS 3C—SiC on silicon). In this method, the SiC layer is generated by implantation of carbon ions into a silicon substrate, heat treatment and removal of the parts of the silicon substrate which have been damaged by the ion implantation.

The surface of the SiC layer exposed in this way can be polished to a roughness of less than 0.5 nm by means of chemical-mechanical polishing, cf. EP 1 727 190 A1, so that GaN can subsequently be grown epitaxially.

WO 98/14986 discloses a method by which two material layers can be separated by exposing the interface of these material layers to electromagnetic radiation. The separation is based on the thermal decomposition of one of the two material layers, close to the interface. In practice, this method may be employed to produce optoelectronic components made of GaN or InGaN on sapphire, and subsequently separate the sapphire layer by thermal decomposition of the GaN or InGaN close to the interface between sapphire and GaN or InGaN.

A disadvantage with this laser lift-off method is the restriction to material systems which decompose under the effect of electromagnetic radiation or by the action of heat. This technologically complex method furthermore requires the use of intense lasers, with wavelengths which have energies exceeding the bandgap of the wide-bandgap semiconductors being used.

SUMMARY OF THE INVENTION

In view of the previously described problems, it is an object of the present invention to provide high-quality epitaxial layers for optoelectronics, which avoid the disadvantages of the methods known in the prior art. These and other objects are achieved by a method for producing a semiconductor structure, comprising providing a 3C—SiC semiconductor layer structure containing a monocrystalline 3C—SiC layer, generated by implantation of carbon in silicon, on a first silicon substrate and applying an epitaxial layer of a nitride compound semiconductor, suitable for the generation of optoelectronic components, onto the 3C—SiC semiconductor layer structure, characterized in that the epitaxial layer of a nitride compound semiconductor is transferred onto a second substrate by bonding the nitride layer onto the surface of the second substrate and mechanically or chemically removing the layers of the 3C—SiC semiconductor layer structure which contain silicon and SiC, the second substrate being a metal alloy with a high reflectivity of greater than or equal to 80% or a substantially transparent substrate.

BRIEF DESCRIPTION OF THE DRAWING

The FIGURE illustrates the steps of preparing the semiconductor structure of claim 1.

DETAILED DESCRIPTION OF THE PREFERRED EMBODIMENTS

The Inventors have discovered that the silicon or the poly-SiC substrate also have detrimental properties in the case of epitaxially grown SiC structures, for example with GaN, since even in this case with a light-emitting diode (LED) produced in the GaN layer, a part of the emitted radiation is absorbed by the substrate and the efficiency is therefore reduced.

Among the various available methods for generating silicon carbide layers, ion beam synthesis is used since the epitaxial layers generated on 3C—SiC have particularly good properties and the production is comparatively favorable. For instance, IBS SiC does not have any micropipes which are regarded as particularly critical in optoelectronics, especially as they lead to total failure of LEDs. The substrates used in this case, for example silicon wafers, are furthermore available in diameters greater than 100 mm, and currently up to 300 mm. Silicon wafers with diameters of 450 mm are in development.

Compared with structures generated by means of other methods and compared with SiC of other polytypes such as 4H and 6H, IBS 3C—SiC also has the advantage that it can be smoothed sufficiently merely by CMP polishing and thereby prepared for a subsequent epitaxy step.

The 3C—SiC substrate is therefore preferably generated by implantation of carbon ions into a silicon substrate, heat treatment of the silicon substrate so that a buried monocrystalline layer of 3C—SiC is formed at a particular depth in the silicon wafer, subsequent removal of the upper layers of the silicon substrate until the 3C—SiC layer is exposed, and subsequent chemical-mechanical polishing of a surface of the exposed 3C—SiC layer.

The term silicon wafer is intended to include all wafers which contain silicon and are suitable for generating buried silicon carbide layers by implantation of carbon.

It is known that silicon wafers which have a (100), (110) or (111) crystal orientation, and which have been produced from either FZ (float zone)- or CZ (Czochralski)-grown crystals, are suitable for this. The silicon wafers preferably have a diameter of 50 mm, 100 mm, 150 mm 200 mm 300 mm or 450 mm.

By the implantation of carbon ions in a silicon wafer, which is preferably carried out at an angle of 0-20° to a surface normal of the silicon wafer, and the subsequent heat treatment which is preferably carried out at a temperature of 1050-1400° C. for a duration of 2-20 hours, a buried monocrystalline 3C—SiC layer is formed in the silicon wafer and noncrystalline transition regions are formed above and below this silicon carbide layer. The transition regions contain SiC precipitates of various polytypes, amorphous polycrystalline SiC and silicon. The upper transition region furthermore comprises a multiplicity of implantation-induced defects.

Only a single implantation step is carried out. In particular, in contrast to WO 03/034484, no second ion implantation for example of helium ions is provided in order to generate a damage layer.

The implantation of carbon ions is preferably carried out at a shallow angle in order to suppress a lattice channeling effect. It is therefore particularly preferable to implant the ions at an angle of 1-10° to a surface normal of the silicon wafer.

The upper silicon layer and the noncrystalline transition region lying above the monocrystalline 3C—SiC layer are subsequently removed, preferably by means of a suitable chemical etching step, by gas phase etching or reactive ion etching, by means of thermal oxidation and subsequent etching or alternatively by mechanical or chemical-mechanical removal processes such as grinding, lapping or polishing. The buried monocrystalline 3C—SiC layer is thereby exposed.

The 3C—SiC layer is then preferably chemically-mechanically polished with a slurry which contains colloidal silicate (silica). Pretreatments of the exposed 3C—SiC layer before the CMP polishing are not provided. In particular mechanical pre-polishing and thermal oxidation, in combination with the CMP polishing, are not provided and are also not preferred.

The polishing time is preferably less than 30 min. A polishing time of less than 15 min is particularly preferred, and a polishing time of less than 5 min is most preferred. The CMP polishing is preferably carried out with a polishing plate rotation speed of 10-100 $\text{min}^{-1}$.

The CMP polishing is preferably carried out with a polishing pressure of greater than or equal to 0.05 bar and less than or equal to 1.0 bar, more preferably at 0.05-0.4 bar and most preferably at 0.05-0.2 bar.

The pH of the slurry being used may be adjusted, for example, by adding sodium hydroxide (NaOH) to the slurry, and is preferably pH 8-11.

The CMP polishing is preferably carried out at a polishing temperature of 20-60° C., more preferably at 20-40° C. and most preferably at room temperature.

The exposed silicon carbide surface is preferably smoothed to a roughness of less than or equal to 0.5 nm RMS by the CMP polishing. Low roughness values of as little as 0.1 nm RMS may be achieved.

An epitaxial layer of a nitride compound semiconductor is subsequently deposited on a surface of the 3C—SiC layer. The epitaxial layer preferably consists of a nitride compound semiconductor selected from a group consisting of aluminum nitride, gallium nitride, indium nitride, gallium-aluminum nitride and gallium-indium nitride, or a layer structure comprising one or more nitride compound semiconductors.

The use of zinc oxide is likewise preferred. This material, however, is relatively expensive.

The epitaxial deposition preferably results in a layer structure comprising an epitaxial layer containing a nitride compound semiconductor, a monocrystalline 3C—SiC layer, a noncrystalline transition region and the remaining silicon residue of the silicon wafer.

The epitaxial layer, consisting for example of a nitride compound semiconductor, is then transferred onto a second substrate.

The second substrate serves to avoid absorption losses which would otherwise occur, and overall to ensure a higher light output than with conventional GaN LEDs on sapphire or SiC substrates.

The second substrate is preferably metallic and has a reflectivity of 80% or more, particularly more preferably a reflectivity of 90% or more.

Transparent or semitransparent substrates with a transmission coefficient of 50% or more, more preferably 80% or more, and most preferably 90% or more, are nevertheless also suitable.

The second substrate is preferably a metal alloy with a high thermal conductivity, and is most preferably a substrate made of a copper alloy. Ag, Al and Au (silver, aluminum, gold) are likewise suitable.

Ag, Al and Au (silver, aluminum, gold) are likewise suitable.

It is also suitable to use a substrate which contains transparent or semitransparent material. This may, for example, be a glass substrate, and there may optionally be a transparent oxide layer on the glass substrate. Indium-tin oxide is particularly preferred.

Indium-tin oxide is particularly preferred.

Substrates or layers which are electrically conductive, and which consists of a material that has a high transmission coefficient for the electromagnetic radiation emitted by the LED chips generated on the nitride layer, are particularly preferred. Indium-tin oxide (ITO) or zinc oxide are suitable in particular.

Transparent plastic substrates or even transparent structured substrates are likewise preferred.

The transfer of the epitaxial layer is preferably carried out by bonding the entire epitaxially grown 3C—SiC layer structure with its epitaxially grown surface onto the second substrate, and subsequently removing all the layers of the 3C—SiC layer structure which contain silicon or silicon carbide, so that only the layer (nitride) previously deposited epitaxially still remains on the second substrate.

The removal of the layers is carried out by mechanical processes such as grinding, lapping or polishing or by wet and dry chemical etching processes, for example with TMAH (tetramethylammonium hydroxide)

It is most preferable for the layers containing silicon or silicon carbide already to have been removed before the epitaxial layer is transferred onto the second substrate, in which case mechanical, chemical or a combination of mechanical and chemical processes are also suitable. In this case, however, a carrier wafer or a film (for example "carbon film") will previously be bonded adhesively onto the epitaxial layer of the layer structure. For example, a wax or a resin (fastening medium) are suitable for the fastening. This should be a material which can readily be dissolved later in a solvent, for example acetone.

It is most preferable first to apply an electrically conductive reflecting layer of a metallic material onto the GaN layer. For example, Ag, Al or Au are suitable for this. This layer may, for example, be vapor-deposited. A carbon film is subsequently applied onto this layer. For further stabilization and with a view to easier handling, a carrier wafer is preferably furthermore fastened. The carrier wafer facilitates handling of the epitaxial layer during the bonding process.

After having applied the carrier wafer and removed the layers of the epitaxially grown 3C—SiC layer structure which contain silicon and silicon carbide, the epitaxial layer is bonded onto a second substrate.

The bonding per se is carried out by any of the bonding methods which have been known for a long time in the semiconductor industry. These essentially involve bringing two surfaces in contact by means of adhesion, hydrophilic/hydrophobic bonding or activation of at least one of the two surfaces to be bonded. Various methods are described in detail by Q. Y. Tong and U. Goesele, "Semiconductor Wafer Bonding", (Science and Technology), Wiley Interscience Publications.

The fastening medium is subsequently dissolved and the carrier wafer is removed from the bonded layer. This leaves the nitride layer which was previously deposited epitaxially onto 3C—SiC, and which is connected to the second substrate.

An essential advantage of the present invention is that the use of ion beam synthesis, and the 3C—SiC layer thereby generated, provides an excellent substrate for the subsequent deposition of nitride compound semiconductors, making it possible to transfer a high-quality layer, for example of a group III nitride, onto another substrate by means of a simple bonding step and simple steps of for example etching or grinding, the second substrate preferably being selected so that components (LEDs) generated on the group III nitride exhibit a better performance/energy budget.

The method of preparing the semiconductor substrates is illustrated in the FIGURE. In step a), a silicon substrate 1 with a 3C—SiC layer 2 is provided. In step b), a GaN layer 3 is deposited onto the 3C—SiC layer 2. In step c), an electrically conductive metal reflecting layer 4 is formed on GaN layer 3. In step d), the silicon substrate 1 and 3C—SiC layer 2 are removed. In step e), the GaN layer 3 is bonded to a metal, metal alloy, or transparent substrate 5.

The invention claimed is:

1. A method for producing a semiconductor structure, comprising:
  a) providing a 3C—SiC semiconductor layer structure containing an exposed, monocrystalline 3C—SiC layer generated by implantation of carbon in silicon on a silicon substrate,
  b) applying an epitaxial layer of a gallium nitride compound semiconductor suitable for the generation of optoelectronic components onto the 3C—SiC semiconductor layer structure,
  c) depositing an electrically conductive reflective metal film directly onto the gallium nitride compound semiconductor epitaxial layer to form a metal reflective film coated gallium nitride layer,
  d) removing the silicon substrate and 3C—SiC layer; and
  e) bonding the surface of the gallium nitride layer which formerly was in contact with the 3C—SiC layer onto a second substrate comprising a metal or metal alloy with a reflectivity greater than 80%, or onto a transparent or partially transparent substrate.

2. The method of claim 1, further comprising adhesively bonding the reflective metal film coated gallium nitride layer to a carrier prior to removing the silicon substrate and 3C—SiC layer.

3. The method of claim 2, wherein the carrier comprises a carrier wafer or carrier film.

4. The method of claim 2, wherein the step of adhesively bonding employs an adhesive composition comprising a wax or a solvent-soluble resin.

5. The method of claim 2, further comprising removing the adhesively bonded carrier wafer after step e).

6. The method of claim 1, wherein the 3C—SiC semiconductor layer is generated by heat treatment of the silicon substrate after implantation of carbon ions to a depth in the silicon substrate, so that a buried monocrystalline layer of 3C—SiC is formed at a depth in the silicon wafer, subsequently removing the layers lying above the buried 3C—SiC layer until the 3C—SiC layer is exposed, and subsequently chemical-mechanical polishing the exposed surface of the monocrystalline 3C—SiC layer.

7. The method of claim 6, wherein the exposed 3C—SiC layer is smoothed to a surface roughness of 0.05-0.5 nm RMS by the polishing.

8. The method of claim 1, wherein the second substrate consists of a metal or a metal alloy.

9. The method of claim 8, wherein the second substrate consists of a copper alloy.

10. The method of claim 1, wherein the second substrate is a glass substrate.

11. The method of claim 1, wherein the removal of the silicon and layers containing silicon carbide of the 3C—SiC layer structure is carried out by grinding, lapping, or polishing, by wet or dry chemical etching processes, or by a combination of mechanical and chemical removal.

12. The method of claim 1, wherein the silicon substrate is a wafer of float zone-grown silicon material.

13. The method of claim 1, wherein the silicon substrate is a wafer of Czochralski-grown silicon material.

14. The method of claim 1, wherein the second substrate is transparent or partially transparent, with a transmission coefficient greater than 50%.

15. The method of claim 1, wherein prior to adhesively bonding, the electrically conductive metal reflective layer is coated with a carbon layer film.

* * * * *